United States Patent
Michael et al.

[11] Patent Number: 5,851,889
[45] Date of Patent: Dec. 22, 1998

[54] SEMICONDUCTOR GATE CONDUCTOR WITH A SUBSTANTIALLY UNIFORM DOPING PROFILE HAVING MINIMAL SUSCEPTIBILITY TO DOPANT PENETRATION INTO THE UNDERLYING GATE DIELECTRIC

[75] Inventors: Mark W. Michael, Cedar Park; Robert Dawson, Austin, both of Tex.

[73] Assignee: Advanced Micro Devices, Inc.

[21] Appl. No.: 792,714

[22] Filed: Jan. 30, 1997

[51] Int. Cl.$^6$ .................................................. H01L 21/336
[52] U.S. Cl. ........................... 438/301; 438/529; 438/532
[58] Field of Search .................................... 438/301, 306, 438/307, 529, 532

[56] References Cited

U.S. PATENT DOCUMENTS

| | | | |
|---|---|---|---|
| 4,438,556 | 3/1984 | Komatsu et al. | 438/532 |
| 5,021,356 | 6/1991 | Henderson et al. | 438/532 |
| 5,346,836 | 9/1994 | Manning et al. | 438/532 |
| 5,501,995 | 3/1996 | Shin et al. | 438/301 |

*Primary Examiner*—Chandra Chaudhari
*Attorney, Agent, or Firm*—Kevin L. Daffer; Conley, Rose & Tayon

[57] ABSTRACT

A semiconductor fabrication process is presented which optimizes the position of impurities within a gate conductor a the source/drain straddling the gate conductor. Optimal positioned is achieved by using separate implants of different energies depending upon whether the gate conductor connotes a PMOS or NMOS transistor. A layer of polysilicon used to form the gate conductor is doped before patterning so that the source and drain regions are protected. A low energy implant is performed when implanting a fast diffuser such as boron, and a high energy implant is performed when implanting a slow diffuser like arsenic. This enables optimum positioning of the impurities throughout the gate conductor cross-section after heat cycles are applied. Fast diffusers are initially placed far from the bottom surface of the polysilicon, and diffuse near the bottom surface of the polysilicon when heat is applied. Slow diffusers are initially placed closer to the bottom surface of the polysilicon, since they do not diffuse as readily. The source and drain regions are implanted using a very low energy implant, separately from the polysilicon implants, to produce a desirable shallow source and drain region within the semiconductor substrate.

10 Claims, 3 Drawing Sheets

SEMICONDUCTOR GATE CONDUCTOR WITH A SUBSTANTIALLY UNIFORM DOPING PROFILE HAVING MINIMAL SUSCEPTIBILITY TO DOPANT PENETRATION INTO THE UNDERLYING GATE DIELECTRIC

BACKGROUND OF THE INVENTION

1. Field of the Invention

This invention relates to semiconductor wafer manufacturing and, more specifically, to a method for doping in two separate steps a gate conductor of an NMOS or PMOS device for optimal conductivity along with minimal opportunity for migration of the dopants from the gate conductor and through the underlying gate dielectric.

2. Description of Relevant Art

Fabrication of a metal-oxide-semiconductor ("MOS") transistor is well-known.

The manufacturing process begins by lightly doping a single-crystal silicon substrate n-type or p-type. The active areas where the transistors and other devices will be formed are then isolated from other active areas with isolation structures. Isolation structures may comprise shallow trenches in the substrate filled with a dielectric. Isolation structures may alternatively comprise local oxidation of silicon ("LOCOS") structures. A gate dielectric is then formed by thermally oxidizing the silicon substrate. This oxidation may be performed in a thermal oxidation furnace or, alternatively, in a rapid-thermal-anneal apparatus. A gate conductor may be formed by depositing polycrystalline silicon ("polysilicon") upon a dielectric-covered semiconductor substrate and then patterning the polysilicon using typical masking and etching techniques. Subsequently, the polysilicon and source/drain regions are concurrently doped, using ion implantation, usually with a high dosage n-type or p-type dopant. If the impurity dopant is n-type, then the resulting transistor is referred to as a NMOS device. Conversely, if the impurity dopant is p-type then the resulting transistor is referred to as a PMOS device.

The resistivity of the polysilicon gate structure is reduced by the introduction of impurities into the structure. Enough dopants are introduced so that the sheet resistivity of the gate conductive structures can be reduced, in some instances, less than approximately 500 ohms/sq. The polysilicon is implanted during the same process step that the source and drain regions are implanted. In an ion implantation process, the depth at which the dopants are implanted can be controlled by adjusting the energy given to the ions by the ion implantation equipment. Ions with higher energy are introduced deeper into the polysilicon. In most cases, implantation into the crystalline source/drain areas through an implant displacement layer which serves to minimize implant channeling and unwanted contaminants from being forwarded into the crystalline material. During subsequent heat processing often needed for example during implant anneal, the implanted dopants further diffuse to assume their final position in the polysilicon gate structure. Dopants with a high diffusivity typically migrate to greater depths within the polysilicon gate than dopants with low diffusivity. Additionally, the bottom interface of the polysilicon layer must be doped to a sufficiently high level to properly control the turn-on characteristics of the transistor.

For modem MOS type transistors, the source and drain regions need to be very shallow. Shallow source and drain regions help reduce susceptibility to short-channel effects, make the device less prone to punchthrough effects, and reduce parasitic capacitance. By reducing the vertical depth of the source and drain regions, the lateral spread of the dopants in these regions beneath the gate structure also becomes smaller. Hence, a longer effective channel is possible for a fixed gate length. To achieve shallow source and drain regions, relatively low implantation energies are used to ensure that the dopants are implanted close to the upper surface of the semiconductor substrate. Since source/drain and gate conductor doping is concurrent, shallow dopants within the source/drain area are also placed a shallow depth within the gate conductor, just below the gate conductor upper surface.

For an NMOS device, arsenic is typically used to dope the polysilicon gate and the source/drain region. Arsenic is a slow diffuser and will not readily migrate even during substantial heat treatment. As a result, the upper portion of the gate conductor receives arsenic and the lower portion generally remains undoped. The undoped lower portion acts as a high resistivity region which deleterious hinders performance of the gate conductor. The high resistivity lower portion not only increases overall resistivity of the gate conductor but also increases the "turn-on" characteristics of the ensuring transistor—possibly beyond an acceptable design limit.

For a PMOS device, boron may be used to dope the gate conductor as well as the source/drain region of the transistor. Boron is typically implanted a fixed distance from the upper surface of the polysilicon which is approximately the same as the distance in which the source/drain implant is implanted from the upper surface of the gate oxide. Boron is considered a fast diffuser and will migrate significantly with subsequent heat processing. As a result, the boron may diffuse from the gate conductor through the gate oxide and into the channel region of the transistor. The presence of boron in the channel may change the doping concentration in the channel which will result in a threshold voltage shift possibly beyond acceptable levels. Boron penetration into the channel can also cause other undesirable effects such as an increase in electron trapping, a decrease in low-field hole mobility, and degradation of current drive.

It would be desirable to derive a fabrication process which can optimally place high diffusivity and/or low diffusivity dopants in the gate conductor so as to ensure a fairly uniform dopant profile throughout a gate conductor cross-section after subsequent heat treatments. The desired fabrication process must be one which can optimally place both high and low diffusivity dopants with a view towards minimizing segregation and migration of highly mobile dopants into the underlying gate dielectric.

SUMMARY OF THE INVENTION

The problems identified above are in large part addressed by a semiconductor process which optimizes the position of impurities forwarded into the gate conductor and the source/drain areas. The optimal position is achieved by performing separate implants of different energies depending upon whether a NMOS or a PMOS device is to be formed. The polysilicon of the gate conductor is doped before patterning. The source/drain regions covered by the polysilicon layer and are not doped during this initial implant step. A low energy implant is performed when implanting a fast diffuser such as boron while a high energy implant is performed when implanting a slow diffuser like arsenic. This enables optimum positioning of the impurities throughout (in the case a the fast diffusers) or near the lower surface of the polysilicon (in the case of a slow diffuser) after subsequent heat processing. Fast diffusers are initially placed far from the bottom surface of the polysilicon and later diffuse near the bottom surface of the polysilicon when subjected to elevated temperatures (i.e., temperatures exceeding for example 800° C). Slow diffusers however, do not readily migrate and therefore remain near the bottom surface after heat processing. The source and drain regions are then implanted after the polysilicon layer is implanted. After portions of the pre-implanted gate conductor are removed, the source/drain regions then receive a very low energy implant to preferably produce very shallow source/drain junctions.

A layer of polysilicon is deposited across and upon the semiconductor substrate. A portion of the polysilicon is then covered with a mask, and a first impurity is driven into the uncovered portions of the polysilicon with a first implant. The first implant is configured to drive the first impurity into the polysilicon such that a first impurity is obtained substantially near the lower surface (within approximately 0.05–0.10 μm) of the polysilicon lower surface. First impurity is a slow diffuser, for example, arsenic. During subsequent heat processing and source/drain formation, the first impurity diffuses sufficiently close to the gate oxide positioned upon the semiconductor substrate to avoid impurity depletion while not substantially diffusing through the gate oxide and into the semiconductor substrate. Subsequently, the first mask is removed and a second portion of the polysilicon is covered. A second impurity is now driven into the uncovered portions of the polysilicon with a second implant. The second implant is configured to drive the second impurity into the polysilicon such that a peak concentration of the second impurity is obtained far from the bottom surface (within approximately 0.10–0.20 μm) of the polysilicon lower surface. Second impurity is a fast diffuser, for example, boron. During subsequent heat processing and source/drain formation, the second impurity diffuses sufficiently close to the gate oxide positioned upon the semiconductor substrate to avoid impurity depletion while not substantially diffusing through the gate oxide and into the semiconductor substrate. Portions of the polysilicon are then removed to form gate structures upon the gate oxide. Source and drain regions are formed within the semiconductor substrate and on opposing sides of the gate structure with separate implants.

BRIEF DESCRIPTION OF THE DRAWINGS

Other objects and advantages of the invention will become apparent upon reading the following detailed description and upon reference to the accompanying drawings in which.

Figure 1:
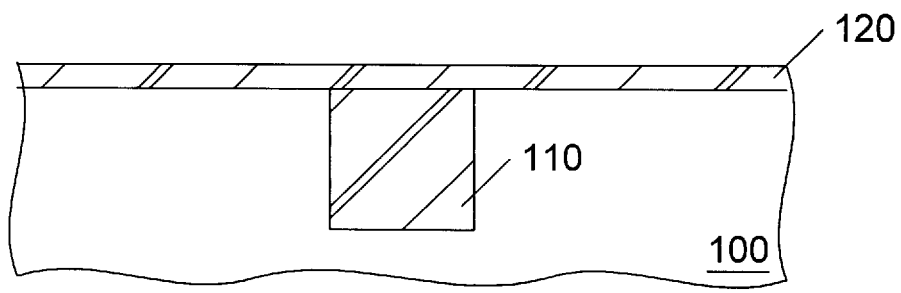
FIG. 1 is a partial cross-sectional view of a semiconductor topography comprising a shallow trench isolation structure and a thin film of thermally-grown gate oxide.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but, on the contrary, the intention is to cover all modifications, equivalents, and alternatives falling within the spirit and scope of the present invention as defined by the appended claims.

DETAILED DESCRIPTION OF THE INVENTION

Turning now to the drawings, FIG. 1 shows semiconductor substrate 100. Semiconductor 100 preferably comprises lightly doped n-type or p-type silicon having a resistivity possibly in the range of approximately 12 ohms-cm. Isolation structure 110 is formed in the field region of semiconductor 100 to electrically isolate the active regions formed within semiconductor 100 from one another. Isolation structure 110 preferably comprises a shallow trench isolation structure. The formation of a shallow trench isolation structure is typically accomplished by anisotropically etching a trench shaped void into semiconductor substrate 100, depositing a dielectric such as CVD oxide into the trench shaped void, and removing the dielectric exterior to the trench, preferably with a chemical-mechanical polish and possibly in combination with traditional mask and etch processes. Alternatively, isolation structures 110 may comprise LOCOS type isolation structures.

Regardless of the way in which isolation is achieved, a gate oxide is formed in active regions subsequent to isolation formation. FIG. 1 illustrates gate oxide 120 preferably grown upon semiconductor substrate 100, using either a dry or wet oxidation process. Gate oxide 120 forms as a silicon dioxide ("oxide") material. Oxidation can occur in a thermal oxidation furnace using temperatures of approximately 700°–900° C. or, alternatively, in a rapid thermal anneal apparatus in which semiconductor substrate 100 is subjected to a temperature of approximately 700°–1000° C. for a relatively short (i.e., less than 20 min) duration. A thickness of gate oxide 120 is preferably between 15 to 200 Å.

Figure 2:
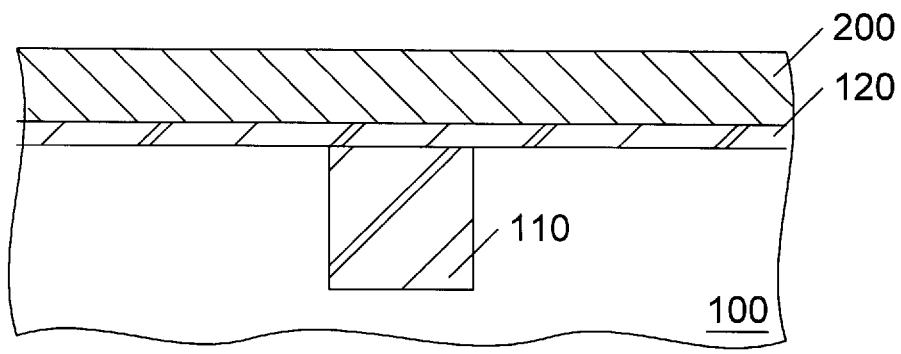
FIG. 2 is a partial cross-sectional view of the semiconductor topography according to a processing step subsequent to FIG. 1 in which a layer of polysilicon is deposited upon the gate oxide layer.

Turning now to FIG. 2, polysilicon layer 200 is deposited upon gate oxide 120. The deposition of polysilicon layer 200 is preferably performed under conditions conducive to producing a substantially conformal film. In one example, a low pressure (i.e., less than approximately 2 torrs) chemical vapor deposition process may be used to deposit a layer of polysilicon. Thickness is preferably 1000–3000 Å.

Figure 3:
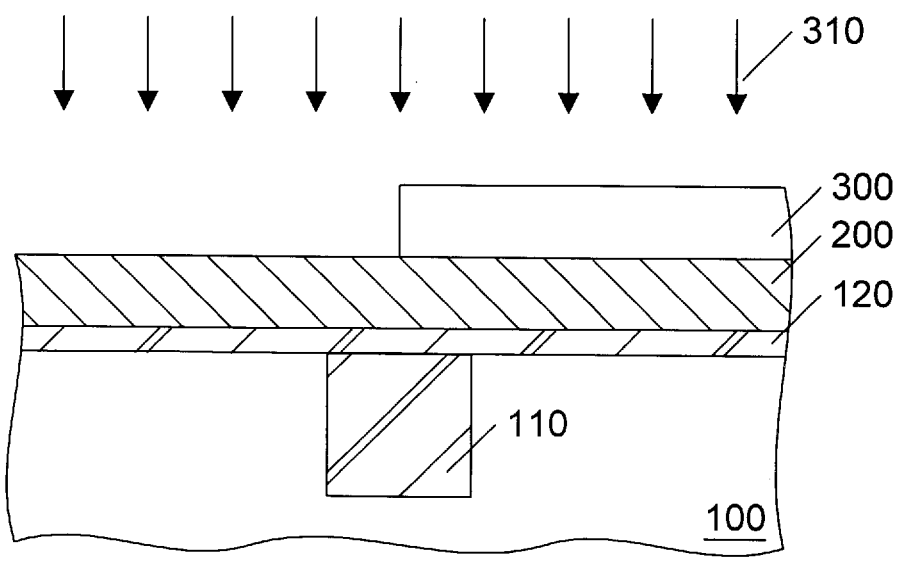
FIG. 3 is a partial cross-sectional view of the semiconductor topography according to a processing step subsequent to FIG. 2 in which a layer of photoresist is deposited and then patterned to expose part of the polysilicon layer which is subsequently doped with an n-type implant.

Turning now to FIG. 3, photoresist layer 300 is deposited upon polysilicon layer 200. Using a traditional mask and etch process, photoresist layer 300 is patterned to expose part of the upper surface of polysilicon layer 200. The exposed part of polysilicon layer 200 is where NMOS type transistors will be subsequently formed. An n-type donor 310, such as arsenic, is then implanted into the exposed part of polysilicon layer 200. An implant with a high energy of approximately 140–200 keV is used such that a peak concentration of impurities 310 is located near the lower surface of polysilicon layer 200. For optimum transistor performance, impurities 310 need to be very close to the lower surface of polysilicon layer 200, but impurities 310 should not penetrate into gate oxide 120 or semiconductor substrate 100. Therefore, the implant needs to be of sufficiently high energy to place the arsenic close to the lower surface of polysilicon layer 200 since arsenic is a slow-diffusing dopant and is not expected to migrate much during subsequent heat processing. If the lower part of the polysilicon gate structure remains undoped it acts as an additional insulating layer between the gate and the channel. Increasing the dopant profile thickness positively affects gate conductor conductivity. If dopant profile thickness does not exist downward near the gate dielectric, effective thickness of the gate dielectric will increase thereby increasing the turn-on threshold voltage of the ensuring transistor.

Figure 4:
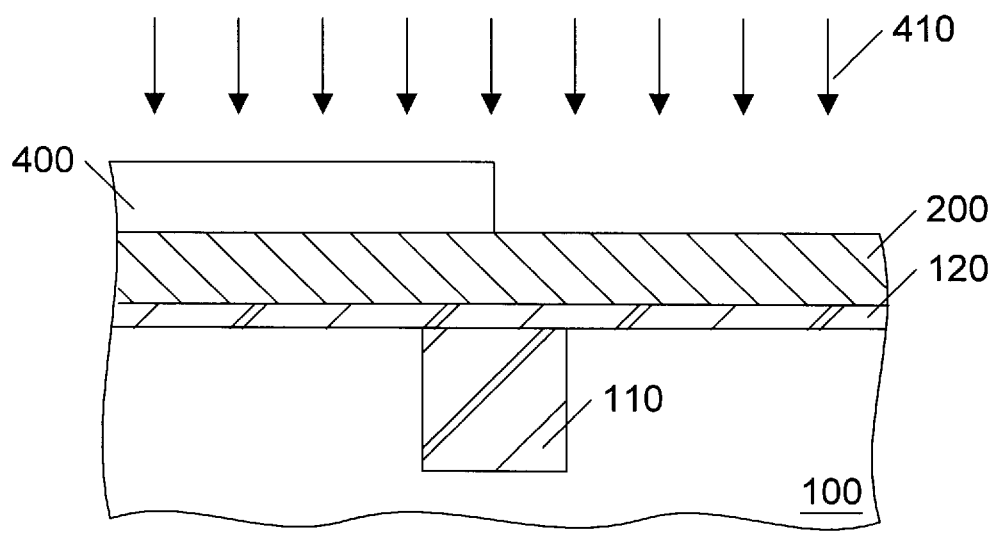
FIG. 4 is a partial cross-sectional view of the semiconductor topography according to a processing step subsequent to FIG. 3 in which a layer of photoresist is deposited and then patterned to expose part of the polysilicon layer which is subsequently doped with a p-type implant.

Turning now to FIG. 4, photoresist layer 300 has been removed and photoresist layer 400 is deposited upon polysilicon layer 200. Using a complimentary mask to the one used to pattern photoresist layer 300, photoresist layer 400 is patterned to expose part of the upper surface of polysilicon layer 200. The exposed part of polysilicon layer 200 is where PMOS type transistors will be subsequently formed. A p-type donor 410, such as boron, is then implanted into the exposed part of polysilicon layer 200. An implant with low energy of approximately 10–30 keV is used such that a peak concentration of impurities 410 is located far from the lower surface of polysilicon layer 200. For optimum transistor performance, impurities 410 need to be very close to the lower surface of polysilicon layer 200, however, impurities 410 should not penetrate into gate oxide 120 or semiconductor substrate 100. Therefore, the implant needs to be of sufficiently low energy to implant the boron near the upper surface of polysilicon layer 200 and far from the lower surface of polysilicon layer 200 since boron is a fast-diffusing dopant and is expected to migrate during subsequent heat processing. Boron should be placed at a distance above the lower surface of polysilicon layer 200 such that subsequent heat processing will cause the boron to diffuse near but not beyond the lower surface of polysilicon layer 200. Boron, after heat treatment (i.e., anneal), is therefore designed to reside preferably throughout the ensuring gate conductor cross-section. Similar to the n-type implant process, p-type boron therefore exists so as to enhance gate conductor conductivity while minimizing boron segregation and diffusion into the underlying gate dielectric.

Figure 5:
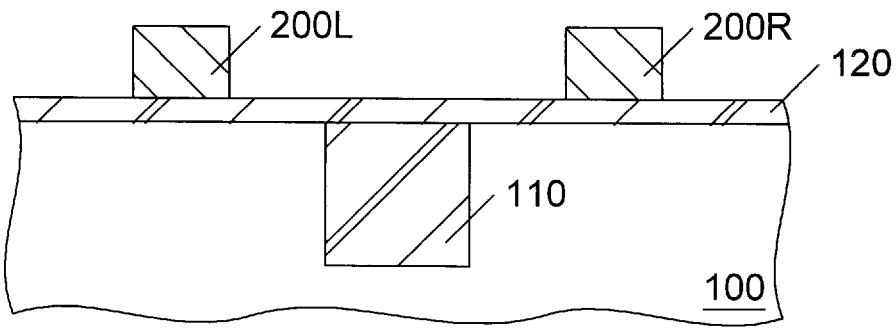
FIG. 5 is a partial cross-sectional view of the semiconductor topography according to a processing step subsequent to FIG. 4 in which the polysilicon layer is patterned to form an n-type gate structure and a p-type gate structure.
Figure 6:
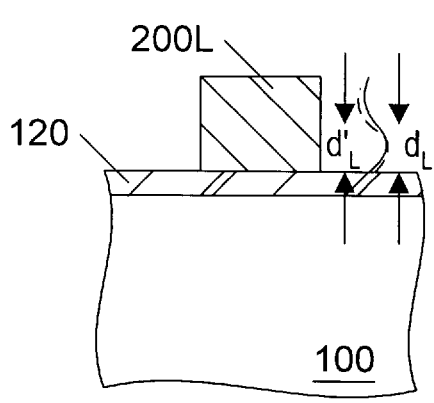
FIG. 6 is a detailed view of the n-doped gate structure of FIG. 5 showing the arsenic doping profile in the gate structure before and after heat processing of the wafer.
Figure 7:
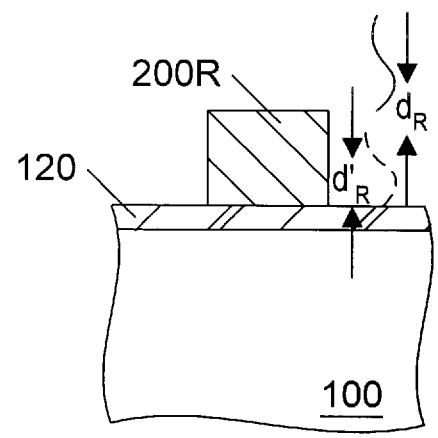
FIG. 7 is an expanded view of the p-doped gate structure of FIG. 5 showing the boron doping profile in the gate structure before and after heat processing of the wafer.

Turning now to FIG. 5, polysilicon layer 200 is patterned to form gate conductors 200L, and 200R. Gate structure 200L is a gate for an NMOS transistor which had been, in the previous steps, doped with a deep arsenic implant. Gate structure 200R is a gate for a PMOS transistor which had been, in the previous steps, doped with a shallow boron implant. Turning now to FIGS. 6 and 7, gate structures 200L and 200R are shown in detail. Gate structure 200L is doped n-type with arsenic. Arsenic has a peak impurity concentration which is at a distance $d_L$ from the lower surface of polysilicon layer 200. Distance $d_L$ is small compared to the overall height of the gate structure. A high energy implant of approximately 140–200 keV is used to place the arsenic close to the lower surface of polysilicon 200. Arsenic is a slow diffuser and is not expected to diffuse much during subsequent heat processing. This ensures an optimized position for the arsenic very close to (at a distance $d_L'$), but not beyond, the lower surface of the lower surface of polysilicon 200. Gate structure 200R is doped p-type with boron. Boron has a peak impurity concentration which is at a distance $d_R$ from the lower surface of polysilicon layer 200. Distance $d_R$ is greater than distance $d_L$. A low energy implant of approximately 10–30 keV is used to implant the boron far from the lower surface of polysilicon 200. Boron is a fast diffuser and is expected to diffuse during subsequent heat processing. This ensures an optimized position for the boron (at a distance $d_R'$), which is very close to, but not beyond, the lower surface of polysilicon 200. Distance $d_R'$ is approximately equal to distance $d_L'$.

Figure 8:
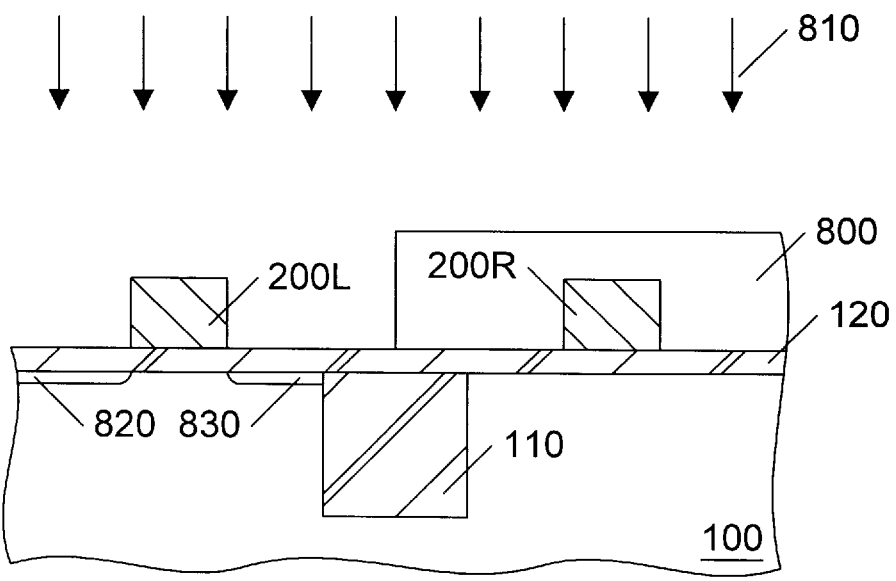
FIG. 8 is a partial cross-sectional view of the semiconductor topography according to a processing step subsequent to FIG. 5 in which a layer of photoresist is deposited and then patterned to expose part of the active region of the semiconductor substrate which is subsequently doped with an n-type implant to create the source/drain regions for the NMOS devices.

Turning now to FIG. 8, photoresist layer 800 is deposited upon the semiconductor topography. Using a traditional mask and etch process, photoresist layer 800 is patterned to expose a portion of the semiconductor substrate. The exposed portion of the semiconductor substrate is where NMOS devices will be subsequently formed. N-type dopant 810, such as arsenic, is then implanted into the exposed portion of the semiconductor substrate to form source and drain regions 820 and 830. The implant energy and dosage is optimized for the source and drain regions since the n-type polysilicon gate implant has already been performed. Shallow source and drain regions are formed, with a concentration of approximately $1-5 \times 10^{15}$ atoms/cm$^2$.

Figure 9:
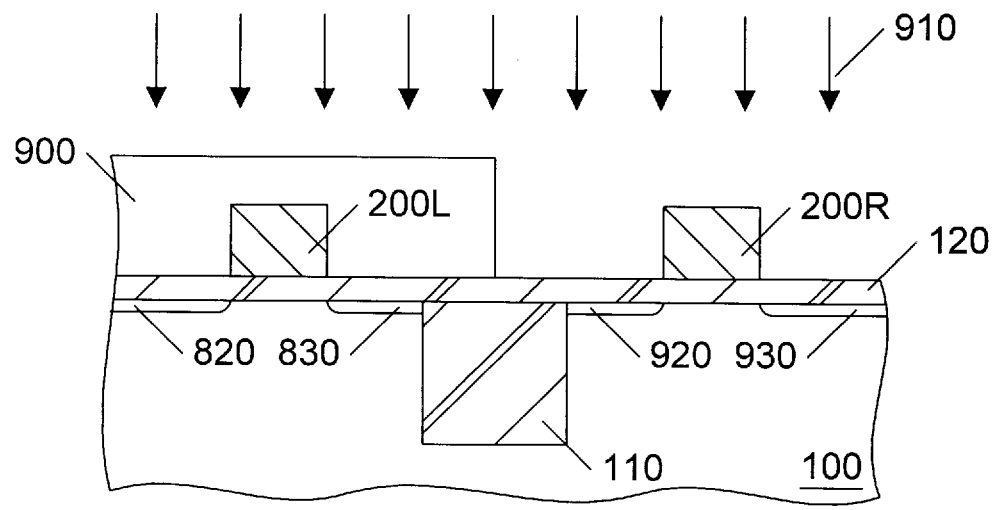
FIG. 9 is a partial cross-sectional view of the semiconductor topography according to a processing step subsequent to FIG. 8 in which a layer of photoresist is deposited and then patterned to expose part of the active region of the semiconductor substrate which is subsequently doped with a p-type implant to create the source/drain regions for the PMOS devices.

Turning now to FIG. 9, photoresist layer 800 is removed and photoresist layer 900 is deposited upon the semiconductor topography. Using a traditional mask and etch process, photoresist layer 900 is patterned to expose a portion of the semiconductor substrate. The exposed portion of the semiconductor substrate is where PMOS devices will be subsequently formed. P-type dopant 910, such as boron, is then implanted into the exposed portion of the semiconductor substrate to form source and drain regions 920 and 930. The implant energy and dosage is optimized for the source and drain regions since the p-type polysilicon gate implant has already been performed. Shallow source and drain regions are formed, with a concentration of approximately $1-5 \times 10^{15}$ atoms/cm$^2$.

It will be appreciated to those skilled in the art having the benefit of this disclosure that this invention is capable of implanting the polysilicon gate and the source/drain regions of a transistor in two separate processing steps such that the depth of the implants is optimized for each case. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A method of forming a doping a polysilicon gate conductor, comprising:

forming a gate oxide upon a semiconductor substrate;

depositing a layer of polysilicon upon and across said gate oxide;

implanting a first impurity into said layer of polysilicon such that a peak concentration of said first impurity is at a first distance from a bottom surface of said layer of polysilicon;

selectively removing select regions of said layer of polysilicon to form a gate structure upon said gate oxide interposed between exposed regions of said semiconductor substrate; and implanting a second impurity into both said gate structure and the exposed regions of said semiconductor substrate.

2. The method as recited in claim 1, wherein said first and second impurities comprises arsenic.

3. The method as recited in claim 2, wherein said second impurity is implanted within said gate structure at a peak concentration shallower than said first distance.

4. The method as recited in claim 1, wherein said first and second impurities comprises boron.

5. The method as recited in claim 4, wherein said second impurity is implanted at a peak concentration within said gate structure at a peak concentration shallower than or approximately the same as said first distance.

6. The method as recited in claim 1, wherein the location of said peak concentration is adjusted so that said first impurity, subsequent to and during further processing steps, diffuses sufficiently close to said gate oxide to avoid impurity depletion without substantially diffusing into and through said gate oxide.

7. A method of forming an MOS transistor comprising a polysilicon gate laterally arranged between a source and a drain region, the method comprising:

depositing a layer of polysilicon upon a semiconductor substrate;

introducing a first impurity within said polysilicon with a first implant;

wherein said first implant is configured to drive said first impurity in said layer of polysilicon such that a peak concentration of said first impurity is obtained substantially near an upper surface of said polysilicon;

selectively removing said polysilicon to form a gate structure upon said semiconductor substrate; and introducing a second impurity within the gate structure, wherein the second impurity comprises an atomic species substantially the same as said first implant.

8. The method as recited in claim 7, wherein the location of said peak concentration is adjusted so that said first impurity, subsequent to and during further processing steps, diffuses sufficiently close to said gate oxide to avoid impurity depletion without substantially diffusing through said gate oxide into said semiconductor substrate.

9. The method as recited in claim 7, wherein said peak concentration lies between x and y microns below the upper surface of said polysilicon.

10. The method as recited in claim 7, wherein said second implant has an energy lower than said first implant and is optimally configured to form a source region and a drain region within said semiconductor substrate on opposite lateral sides of said gate structure.

* * * * *